US011101151B2

(12) United States Patent
Takenouchi et al.

(10) Patent No.: US 11,101,151 B2
(45) Date of Patent: Aug. 24, 2021

(54) PACKAGE SUBSTRATE PROCESSING METHOD

(71) Applicant: DISCO CORPORATION, Tokyo (JP)

(72) Inventors: Kenji Takenouchi, Tokyo (JP); Mitsutane Kokubu, Tokyo (JP); Naoko Yamamoto, Tokyo (JP); Chisato Yamada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 61 days.

(21) Appl. No.: 16/540,598

(22) Filed: Aug. 14, 2019

(65) Prior Publication Data
US 2020/0058525 A1  Feb. 20, 2020

(30) Foreign Application Priority Data

Aug. 17, 2018  (JP) .............................. JP2018-153474

(51) Int. Cl.
*H01L 21/67*  (2006.01)
*H01L 21/56*  (2006.01)

(52) U.S. Cl.
CPC ........ *H01L 21/67092* (2013.01); *H01L 21/56* (2013.01); *H01L 21/561* (2013.01); *H01L 21/67023* (2013.01); *H01L 21/67121* (2013.01); *H01L 21/67132* (2013.01)

(58) Field of Classification Search
CPC ....... H01L 2924/00; H01L 2924/00014; H01L 2924/00012; H01L 2224/73265; H01L 2224/48091
See application file for complete search history.

(56) References Cited

U.S. PATENT DOCUMENTS

2015/0262881 A1* 9/2015 Takenouchi ............ H01L 21/78
438/460

FOREIGN PATENT DOCUMENTS

JP  2016157722 A  9/2016
JP  2016181569 A  10/2016

OTHER PUBLICATIONS

2016181569 [machine1 s translation] (Year: 2016).*

* cited by examiner

*Primary Examiner* — Tony Tran
(74) *Attorney, Agent, or Firm* — Greer Burns & Crain, Ltd.

(57) ABSTRACT

A package substrate processing method for processing a package substrate having a division line, an electrode being formed on the division line includes a cutting step of cutting the package substrate along the division line by using a cutting blade and a burr removing step of removing burrs produced from the electrode in the cutting step by spraying a fluid to the package substrate along the division line after performing the cutting step. The cutting step includes a step of supplying a cutting liquid containing an organic acid and an oxidizing agent to a cutting area where the package substrate is to be cut by the cutting blade.

12 Claims, 10 Drawing Sheets

PACKAGE SUBSTRATE PROCESSING METHOD

BACKGROUND OF THE INVENTION

Field of the Invention

The present invention relates to a package substrate processing method for use in cutting a package substrate.

Description of the Related Art

A package substrate is formed by providing a plurality of device chips arranged on a substrate and covering the device chips with resin (mold resin) as a sealing material. A plurality of division lines (streets) are formed on the package substrate so as to separate the plural device chips. By dividing the package substrate along the division lines, a plurality of package devices respectively including the plural device chips are obtained. For example, the package substrate is divided by using a cutting apparatus including a chuck table for holding the package substrate and an annular cutting blade for cutting the package substrate, the cutting blade being mounted on a spindle. In operation, the package substrate is held on the chuck table, and the cutting blade is rotated to cut the package substrate along each division line.

There is a case that electrodes connected to each device chip are formed on each division line of the package substrate. When the package substrate is cut along each division line by using the cutting blade in this case, the cutting blade being rotated comes into contact with the electrodes formed on each division line, so that each electrode is drawn by the cutting blade to cause the production of whisker-shaped burrs. The burrs may cause a short circuit between the electrodes or defective bonding of each package device obtained by dividing the package substrate, resulting in a reduction in quality of each package device. It is therefore desirable to remove the burrs. There has been proposed a technique of removing the burrs by spraying water toward a cut area of the package substrate after cutting the package substrate by using a cutting blade. For example, Japanese Patent Laid-Open No. 2016-157722 discloses a cutting apparatus including a burr removing nozzle located adjacent to the cutting blade. In this cutting apparatus, the package substrate is cut by using the cutting blade, and the burrs are next removed by spraying water from the burr removing nozzle toward the package substrate.

When the water is sprayed toward the package substrate cut by the cutting blade, there is a possibility that a part of the package substrate may be scattered by the pressure of the water sprayed. Further, in the case that the package substrate is attached to an adhesive tape, the package substrate is fully cut by the cutting blade in the condition where the package substrate is held through the adhesive tape on the chuck table. As a result, the adhesive tape is exposed to a cut area (cut groove) of the package substrate. In this case, there is a possibility that the adhesive tape exposed may be broken by the pressure of the water sprayed to the cut area of the package substrate. Accordingly, the pressure of the water to be sprayed is set in such a range that such an inconvenience in processing the package substrate does not occur. However, when the water pressure is set to a low pressure, so as to prevent the occurrence of the inconvenience, the removal of the burrs tends to become insufficient.

On the other hand, Japanese Patent Laid-Open No. 2016-181569 discloses a technique of removing the burrs by spraying water to the package substrate in the condition where the package substrate is not fully cut. More specifically, this technique includes a first-time cutting operation of forming a cut groove having a depth less than the thickness of the package substrate along each division line to thereby cut each electrode. Thereafter, water is sprayed toward each cut groove to thereby remove the burrs. Thereafter, a second-time cutting operation is performed to cut the package substrate along each cut groove, i.e., along each division line, thereby fully cutting the package substrate. According to this technique, the water is sprayed to the package substrate in the condition where the package substrate is not fully cut, so that the scatter of a part of the package substrate or the breakage of the adhesive tape due to the spraying of the water can be suppressed. Accordingly, the pressure of the water to be sprayed can be increased to thereby facilitate the removal of the burrs.

SUMMARY OF THE INVENTION

In the case of using the above former technique of removing the burrs by spraying water to the package substrate after fully cutting the package substrate, the pressure of the water to be sprayed must be set to a low pressure, so as to prevent the occurrence of the inconvenience in processing the package substrate, so that the removal of the burrs is insufficient. Further, in the case of using the above latter technique of performing the cutting operation twice along each division line, the pressure of the water for removing the burrs can be increased as compared with the case of spraying the water after fully cutting the package substrate. However, since the cutting operation must be performed plural times along each division line, a processing efficiency is reduced. In addition, in the second-time cutting operation, the cutting blade comes into contact with each electrode cut and exposed to each cut groove formed in the first-time cutting operation, so that burrs are produced again.

It is therefore an object of the present invention to provide a package substrate processing method which can remove the burrs as suppressing the occurrence of the inconvenience in processing the package substrate and also suppressing a reduction in processing efficiency.

In accordance with an aspect of the present invention, there is provided a package substrate processing method for processing a package substrate having a division line, an electrode being formed on the division line, the package substrate processing method including a cutting step of cutting the package substrate along the division line by using a cutting blade; and a burr removing step of removing burrs produced from the electrode in the cutting step by spraying a fluid to the package substrate along the division line after performing the cutting step. The cutting step includes a step of supplying a cutting liquid containing an organic acid and an oxidizing agent to a cutting area where the package substrate is to be cut by the cutting blade.

Preferably, the package substrate processing method further includes a tape attaching step of attaching an adhesive tape to the package substrate before performing the cutting step; and a holding step of holding the package substrate through the adhesive tape on a holding unit after performing the tape attaching step and before performing the cutting step; the cutting step being performed by fully cutting the package substrate attached to the adhesive tape along the division line to a depth where the cutting blade reaches the adhesive tape in a condition where the package substrate is held through the adhesive tape on the holding unit; the burr removing step being performed by spraying the fluid in a condition where the adhesive tape is attached to the package substrate.

As an alternative preferable mode, the package substrate processing method further includes a holding step of holding the package substrate on a jig table having a groove corresponding to the division line, before performing the cutting step; the cutting step being performed by fully cutting the package substrate along the division line to the depth where the cutting blade reaches the groove of the jig table in a condition where the package substrate is held on the jig table; the burr removing step being performed by spraying the fluid to the package substrate held on the jig table.

In the package substrate processing method according to the present invention, the cutting step is performed to cut the package substrate by using the cutting blade as supplying the cutting liquid containing the organic acid and the oxidizing agent. Thereafter, the burr removing step is performed to remove the burrs by spraying the fluid. By supplying the cutting liquid containing the organic acid and the oxidizing agent, the production of the burrs can be suppressed and the burrs can be easily removed in the next step. Accordingly, the pressure of the fluid for removing the burrs can be reduced. As a result, the burrs can be removed as suppressing the occurrence of the inconvenience in processing the package substrate and also suppressing a reduction in processing efficiency.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1A:
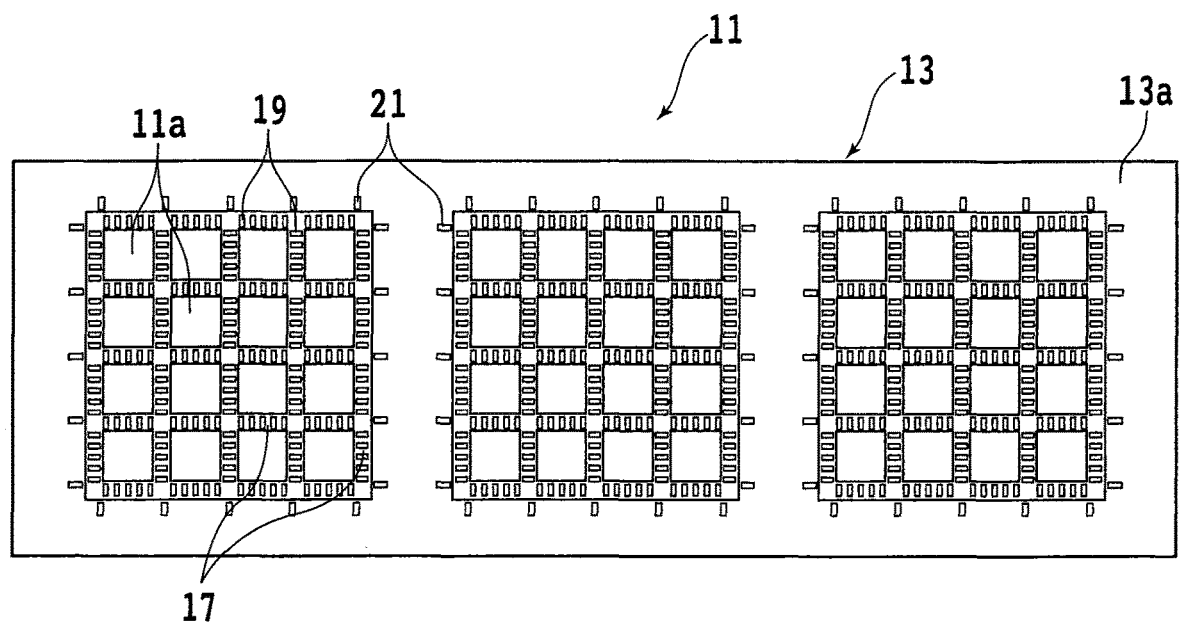
FIG. 1A is a top plan view depicting a package substrate.
Figure 1B:
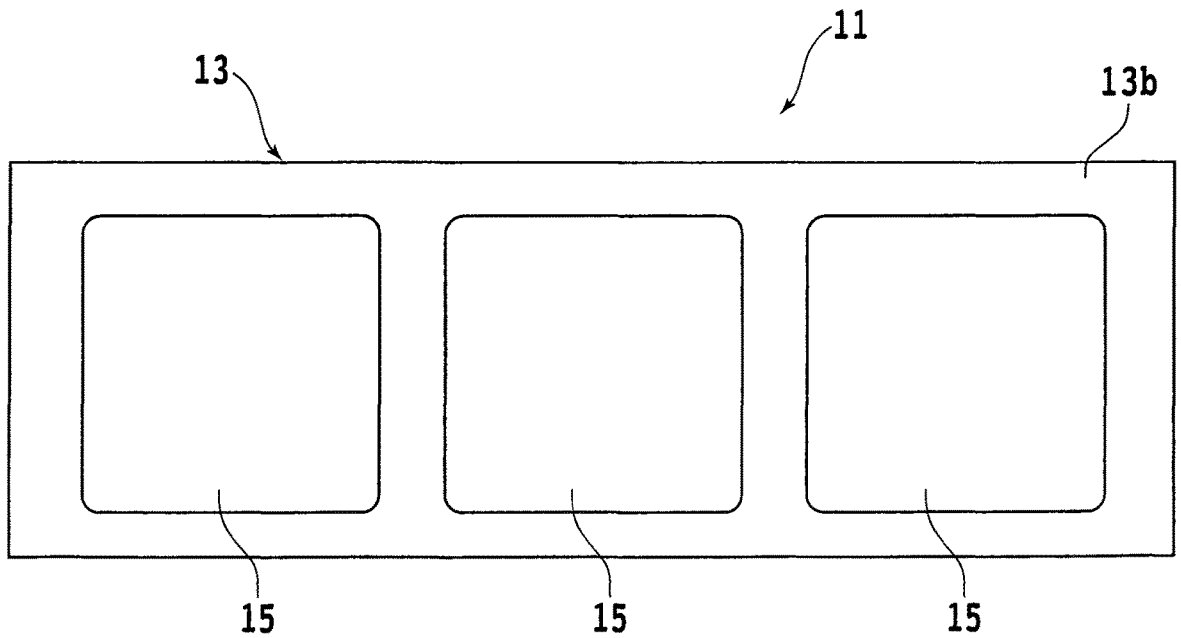
FIG. 1B is a bottom plan view of the package substrate depicted in FIG. 1A.

A first preferred embodiment of the present invention will now be described with reference to the attached drawings. There will first be described a package substrate that can be processed by a package substrate processing method according to this preferred embodiment. FIG. 1A is a top plan view depicting the front side of a package substrate 11, and FIG. 1B is a bottom plan view depicting the back side of the package substrate 11 depicted in FIG. 1A. As depicted in FIGS. 1A and 1B, the package substrate 11 includes a plate-shaped substrate 13 having a front side 13a and a back side 13b, the plate-shaped substrate 13 being rectangular as viewed in plan. The package substrate 11 further includes a plurality of device chips (not depicted) arranged on the back side 13b of the substrate 13, each device chip including a device such as an integrated circuit (IC). Further, a resin layer (mold resin) 15 for sealing the plural device chips is formed on the back side 13b of the substrate 13.

As depicted in FIG. 1A, a plurality of crossing division lines (streets) 17 are formed on the package substrate 11 to thereby define a plurality of rectangular separate regions 11a where the plural device chips are respectively located. The package substrate 11 is not limited in material, shape, structure, size, etc. Further, the device chips are not limited in kind, number, shape, structure, size, layout, etc. By cutting the package substrate 11 along each division line 17, a plurality of package devices respectively including the plural device chips can be obtained. For example, an annular cutting blade may be used to cut the package substrate 11. A plurality of markers 21 indicating the positions of the division lines 17 are provided on the front side 13a of the substrate 13. Each marker 21 functions as a mark for use in performing the alignment between the package substrate 11 and the cutting blade.

Further, a plurality of electrodes 19 formed of metal are arranged along each division line 17 on the front side 13a of the substrate 13. These electrodes 19 are connected through metal wires (not depicted) to each device chip provided on the back side 13b of the substrate 13. Thus, each electrode 19 is exposed to the front side 13a of the substrate 13. After dividing the package substrate 11 into the plural package devices, these electrodes 19 function as connection electrodes in mounting each package device on another mounting substrate or the like.

Figure 2:
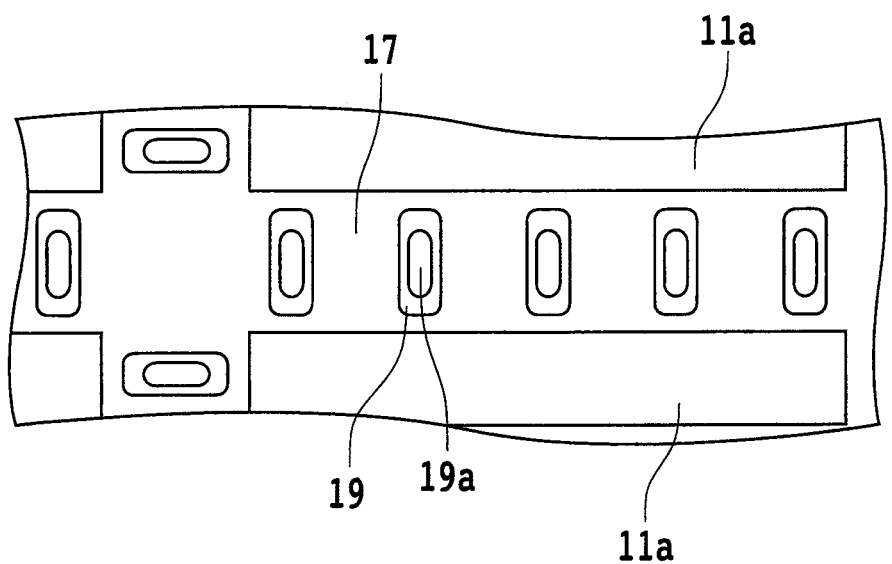
FIG. 2 is an enlarged plan view depicting an essential part of the package substrate depicted in FIG. 1A.

FIG. 2 is an enlarged plan view depicting an essential part of the package substrate 11. As depicted in FIG. 2, each of the plural electrodes 19 formed on each division line 17 is provided with a cavity 19a having a depth from the front side 13a of the substrate 13 toward the back side 13b thereof. The cavity 19a of each electrode 19 is elliptical or oval as viewed in plan. The depth of each cavity 19a is smaller than the thickness of each electrode 19. Accordingly, when the package substrate 11 is cut along each division line 17 by using a cutting blade, each of the plural electrodes 19 formed on each division line 17 is also cut by the cutting blade. At this time, the cutting blade is positioned so as to pass through the inside of the cavity 19a of each electrode 19, that is, pass within the length of the cavity 19a in its longitudinal direction. Accordingly, the cavity 19a of each electrode 19 is cut in its lateral direction by the cutting blade, thereby forming a space to be filled with a metal material (e.g., solder) for connecting each electrode 19 to another electrode (e.g., each connection electrode on the mounting substrate).

Figure 3:
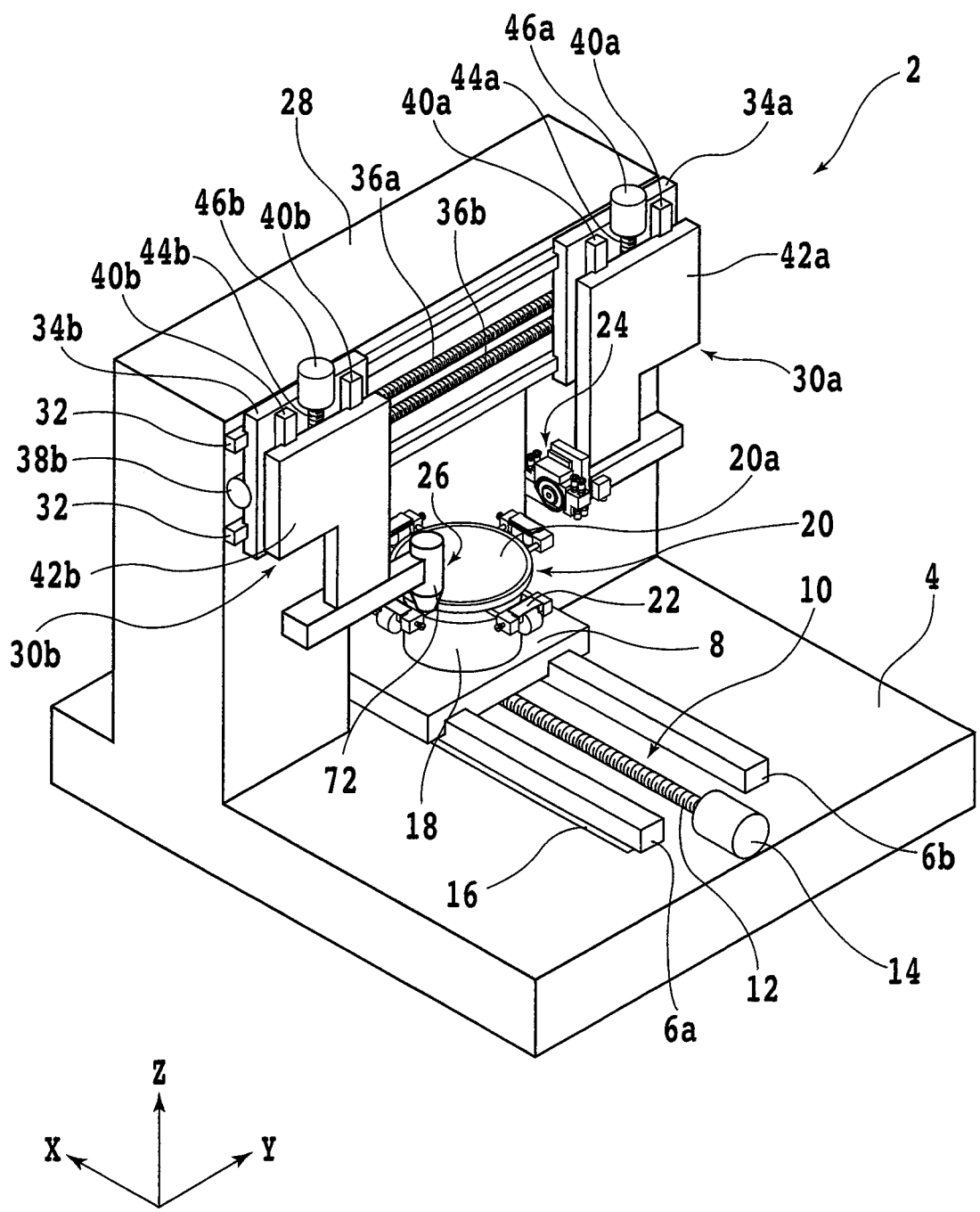
FIG. 3 is a perspective view depicting a cutting apparatus for processing the package substrate.

In cutting the package substrate 11 along each division line 17 by using a cutting blade, the cutting blade comes into contact with each electrode 19. Accordingly, there is a possibility that each electrode 19 may be drawn by the cutting blade being rotated, causing the production of whisker-shaped burrs. The burrs may cause a short circuit between the electrodes 19 or defective bonding in mounting each package device, so that it is preferable to remove the burrs. For example, the burrs produced in cutting the package substrate 11 may be removed by spraying a fluid such as water under pressure toward the burrs to thereby blow away the burrs. Cutting of the package substrate 11 and spraying of the fluid may be performed by using a cutting apparatus including a cutting unit for cutting the package substrate 11 and a fluid spraying unit for spraying the fluid toward the package substrate 11. FIG. 3 depicts a cutting apparatus 2 including such a cutting unit and a fluid spraying unit, which will be hereinafter described in detail.

FIG. 3 is a perspective view depicting the configuration of the cutting apparatus 2. As depicted in FIG. 3, the cutting apparatus 2 includes a base 4 for supporting various components of the cutting apparatus 2. A pair of parallel guide rails 6a and 6b are fixed to the upper surface of the base 4 so as to extend in the X direction (feeding direction) depicted by an arrow X in FIG. 3. A movable block 8 is slidably mounted on the guide rails 6a and 6b. The movable block 8 is connected to a moving unit 10 for moving the movable block 8 in the X direction. The moving unit 10 includes a ball screw 12 and a pulse motor 14 for rotating the ball screw 12. The ball screw 12 extends in the X direction. The movable block 8 has a nut portion (not depicted) threadedly engaged with the ball screw 12. The pulse motor 14 is connected to one end of the ball screw 12. Accordingly, when the ball screw 12 is rotated by the pulse motor 14, the movable block 8 is moved along the guide rails 6a and 6b in the X direction. Further, the moving unit 10 includes a scale 16 provided on the base 4 along the guide rail 6a, the scale 16 having coordinate values indicating the positions of the movable block 8, and a read head (not depicted) for reading the coordinate values of the scale 16. Accordingly, by operating the read head to read the coordinate values of the scale 16, the positions of the movable block 8 can be determined.

A cylindrical support member 18 is provided on the movable block 8, and a chuck table 20 is fixed to the upper end of the support member 18. The chuck table 20 corresponds to a holding unit (holding means) for holding the package substrate 11. The chuck table 20 is connected to a rotational drive source (not depicted) such as a motor for rotating the chuck table 20. That is, the chuck table 20 has a rotation axis substantially parallel to the Z direction (vertical direction) depicted by an arrow Z in FIG. 3, so that the chuck table 20 is rotated about its vertical axis by operating the rotational drive source. Further, the X position of the chuck table 20 in the X direction is controlled by the moving unit 10. The chuck table 20 has an upper surface as a holding surface 20a for holding the package substrate 11. The holding surface 20a is formed of porous ceramic, for example. The holding surface 20a is substantially parallel to the X direction and the Y direction (indexing direction) depicted by an arrow Y in FIG. 3, in which the Y direction is perpendicular to the X direction in a horizontal plane. Further, the chuck table 20 is connected through a suction passage (not depicted) to a vacuum source (not depicted) such as an ejector, in which the suction passage is formed inside the chuck table 20.

Figure 4:
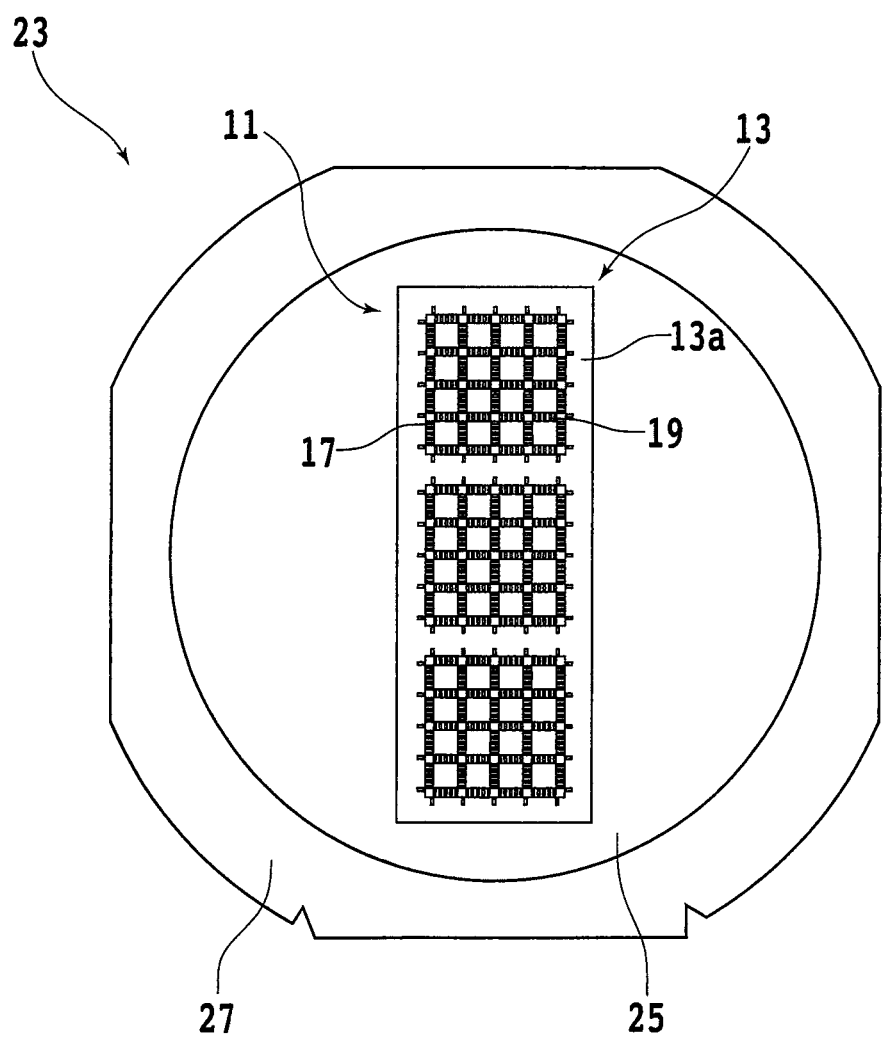
FIG. 4 is a plan view depicting a frame unit formed by supporting the package substrate through an adhesive tape to an annular frame.

In cutting the package substrate 11, the package substrate 11 is supported through an adhesive tape to an annular frame, and the package substrate 11 thus supported to the annular frame is held on the chuck table 20. FIG. 4 is a plan view depicting a frame unit 23 formed by supporting the package substrate 11 through a circular adhesive tape 25 to an annular frame 27. The circular adhesive tape 25 has a diameter capable of covering the whole of the package substrate 11. That is, the diameter of the circular adhesive tape 25 is larger than the length of the rectangular package substrate 11 in its longitudinal direction. The adhesive tape 25 is attached to the resin layer 15 (see FIG. 1B) of the package substrate 11, that is, attached to the back side 13b of the substrate 13. The adhesive tape 25 is a soft film composed of a base sheet and an adhesive layer (sticky layer) formed on the base sheet. The base sheet may be formed of resin such as polyolefin, polyvinyl chloride, and polyethylene terephthalate. The adhesive layer may be formed of rubber adhesive or acrylic adhesive. The annular frame 27 is attached to a peripheral portion of the adhesive tape 25, and the package substrate 11 is attached to a central portion of the adhesive tape 25 in the condition where the front side 13a of the substrate 13 is exposed upward. Thus, the frame unit 23 is composed of the package substrate 11, the adhesive tape 25, and the annular frame 27 united together. That is, the package substrate 11 is supported through the adhesive tape 25 to the annular frame 27 in the condition where the front side 13a of the substrate 13 is exposed upward.

As depicted in FIG. 3, four clamps 22 for clamping the annular frame 27 are provided on the outer circumference of the chuck table 20. The four clamps 22 are arranged at equal intervals. Further, a transfer unit (not depicted) for transferring the package substrate 11 (the frame unit 23) to the chuck table 20 is provided in the vicinity of the chuck table 20. In processing the package substrate 11, the package substrate 11 is first placed through the adhesive tape 25 on the holding surface 20a of the chuck table 20, and the annular frame 27 is next fixed by the clamps 22. Thereafter, a vacuum produced by the vacuum source is applied to the holding surface 20a to thereby hold the package substrate 11 through the adhesive tape 25 on the holding surface 20a of the chuck table 20.

There are provided above the chuck table 20 a cutting unit 24 having an annular cutting blade for cutting the package substrate 11 (the cutting blade will be hereinafter described) and a fluid spraying unit 26 for spraying a fluid toward the package substrate 11. A double column type support structure 28 for supporting the cutting unit 24 and the fluid spraying unit 26 is provided on the upper surface of the base 4 so as to straddle the chuck table 20.

There are provided on the front surface of the upper portion of the support structure 28 a moving unit 30a for moving the cutting unit 24 in the Y direction and the Z direction and a moving unit 30b for moving the fluid spraying unit 26 in the Y direction and the Z direction. The moving unit 30a includes a movable plate 34a, and the moving unit 30b includes a movable plate 34b. A pair of parallel guide rails 32 are fixed to the front surface of the support structure 28 so as to extend in the Y direction. The movable plates 34a and 34b are slidably mounted on the guide rails 32. A nut portion (not depicted) is provided on the back side (rear surface) of the movable plate 34a, and a ball screw 36a extending substantially parallel to the guide rails 32 is threadedly engaged with this nut portion of the movable plate 34a. Similarly, a nut portion (not depicted) is provided on the back side (rear surface) of the movable plate 34b, and a ball screw 36b extending substantially parallel to the guide rails 32 is threadedly engaged with this nut portion of the movable plate 34b. A pulse motor (not seen in FIG. 3) is connected to one end of the ball screw 36a, and a pulse motor 38b is connected to one end of the ball screw 36b. Accordingly, by operating the pulse motor to rotate the ball screw 36a, the movable plate 34a can be moved along the guide rails 32 in the Y direction. Similarly, by operating the pulse motor 38b to rotate the ball screw 36b, the movable plate 34b can be moved along the guide rails 32 in the Y direction.

A pair of parallel guide rails 40a are fixed to the front side (front surface) of the movable plate 34a so as to extend in the Z direction. Similarly, a pair of parallel guide rails 40b are fixed to the front side (front surface) of the movable plate 34b so as to extend in the Z direction. A movable plate 42a is slidably mounted on the guide rails 40a, and a movable plate 42b is slidably mounted on the guide rails 40b.

A nut portion (not depicted) is provided on the back side (rear surface) of the movable plate 42a, and a ball screw 44a extending substantially parallel to the guide rails 40a is threadedly engaged with this nut portion of the movable plate 42a. A pulse motor 46a is connected to one end of the ball screw 44a. Accordingly, by operating the pulse motor 46a to rotate the ball screw 44a, the movable plate 42a can be moved along the guide rails 40a in the Z direction. Similarly, a nut portion (not depicted) is provided on the back side (rear surface) of the movable plate 42b, and a ball screw 44b extending substantially parallel to the guide rails 40b is threadedly engaged with this nut portion of the movable plate 42b. A pulse motor 46b is connected to one end of the ball screw 44b. Accordingly, by operating the pulse motor 46b to rotate the ball screw 44b, the movable plate 42b can be moved along the guide rails 40b in the Z direction.

The cutting unit 24 is provided at the lower portion of the movable plate 42a, and the fluid spraying unit 26 is provided at the lower portion of the movable plate 42b. The Y position of the cutting unit 24 in the Y direction and the Z position of the cutting unit 24 in the Z direction are controlled by the moving unit 30a. Similarly, the Y position of the fluid spraying unit 26 in the Y direction and the Z position of the fluid spraying unit 26 in the Z direction are controlled by the moving unit 30b. That is, the position of the cutting unit 24 and the position of the fluid spraying unit 26 are controlled independently of each other.

Figure 5:
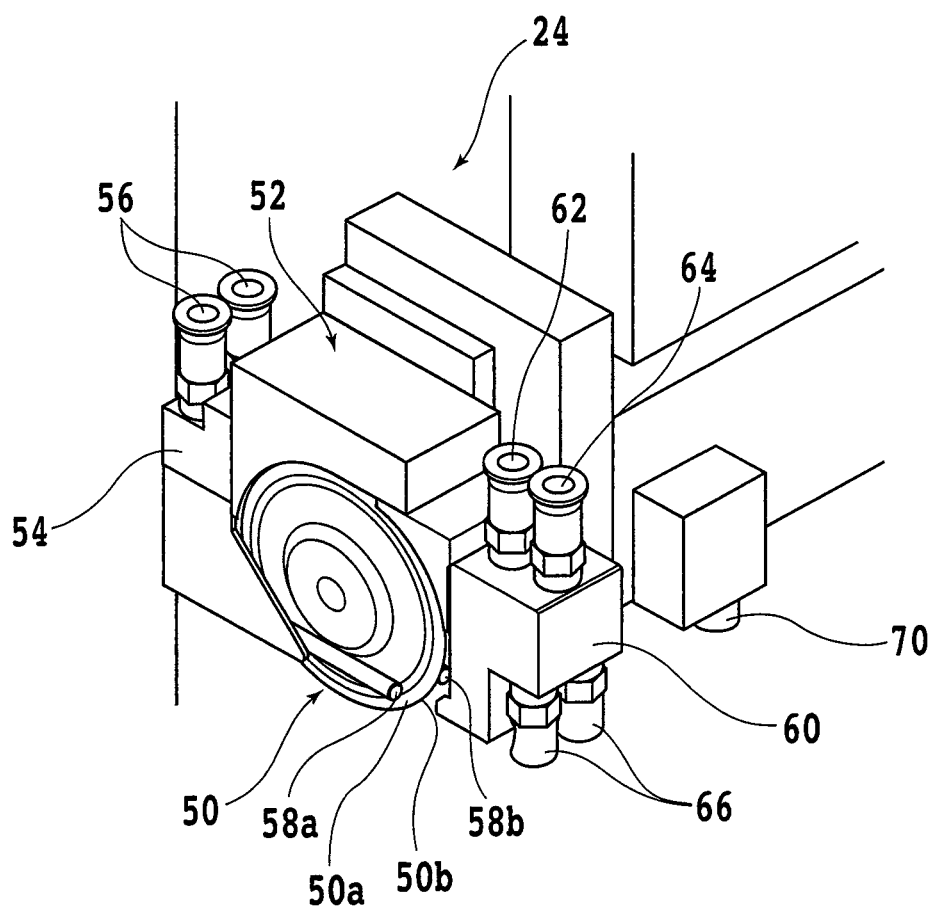
FIG. 5 is a perspective view depicting a cutting unit included in the cutting apparatus depicted in FIG. 3.

FIG. 5 is a perspective view depicting the cutting unit 24. As depicted in FIG. 5, the cutting unit 24 includes a spindle (not depicted) having an axis substantially parallel to the holding surface 20a of the chuck table 20. More specifically, the axis of the spindle extends in the Y direction. An annular cutting blade 50 is mounted on the front end portion of the spindle. The spindle is connected to a rotational drive source such as a motor. Accordingly, the cutting blade 50 mounted on the spindle is rotated by a force transmitted from the rotational drive source. The cutting blade 50 is formed by binding abrasive grains such as diamond abrasive grains with a bond such as a metal bond, resin bond, and vitrified bond.

The cutting unit 24 further includes a blade cover 52 for covering the cutting blade 50. The blade cover 52 includes a first nozzle block 54 for supplying a cutting liquid to the cutting blade 50. The first nozzle block 54 includes a first connecting portion 56 connected to a hose (not depicted) for supplying the cutting liquid and a pair of blade cooler nozzles 58a and 58b connected to the first connecting portion 56 for supplying the cutting liquid to the cutting blade 50. The blade cooler nozzles 58a and 58b are arranged so as to interpose the cutting blade 50. That is, the blade cooler nozzle 58a is opposed to one side surface 50a of the cutting blade 50, and the blade cooler nozzle 58b is opposed to the other side surface 50b of the cutting blade 50. Each of the blade cooler nozzles 58a and 58b has a plurality of nozzle openings (not depicted) directed to the cutting blade 50 for supplying the cutting liquid to the cutting blade 50.

Accordingly, the cutting liquid supplied to the first connecting portion 56 is introduced to the blade cooler nozzles 58a and 58b and then sprayed from the nozzle openings of the blade cooler nozzles 58a and 58b toward the opposed side surfaces 50a and 50b of the cutting blade 50.

The blade cover 52 further includes a second nozzle block 60 for supplying the cutting liquid to the cutting blade 50 and the package substrate 11 held on the chuck table 20. The second nozzle block 60 includes a second connecting portion 62 and a third connecting portion 64 connected to hoses (not depicted) for supplying the cutting liquid. The second connecting portion 62 is connected to a shower nozzle (not depicted) provided inside the second nozzle block 60. The shower nozzle has a front end opening toward the outer circumferential portion of the cutting blade 50. Accordingly, the cutting liquid supplied to the second connecting portion 62 is introduced to the shower nozzle and then sprayed from the front end of the shower nozzle toward the outer circumferential portion of the cutting blade 50. Further, the cutting liquid is supplied to a contact area between the cutting blade 50 and the package substrate 11 by the rotation of the cutting blade 50. The third connecting portion 64 is connected to a pair of spray nozzles 66 for supplying the cutting liquid to the package substrate 11 held on the chuck table 20. The spray nozzles 66 have front ends opening toward the holding surface 20a of the chuck table 20. Accordingly, the cutting liquid supplied to the third connecting portion 64 is introduced to the spray nozzles 66 and then sprayed from the front ends of the spray nozzles 66 toward the upper surface of the package substrate 11 held on the chuck table 20.

In cutting the package substrate 11 by using the cutting blade 50, the cutting liquid is supplied from the blade cooler nozzles 58a and 58b, the shower nozzle, and the spray nozzles 66 to the cutting blade 50 and the package substrate 11. By supplying the cutting liquid, the contact area between the cutting blade 50 and the package substrate 11 can be cooled and any dust (cutting dust) generated in cutting the package substrate 11 can be washed away. Further, an imaging unit 70 for imaging the package substrate 11 held on the chuck table 20 is provided adjacent to the cutting unit 24. According to an image obtained by the imaging unit 70, the alignment between the cutting unit 24 and the chuck table 20 is performed.

The fluid spraying unit 26 depicted in FIG. 3 includes a spray nozzle 72 for spraying a fluid toward the package substrate 11 held on the chuck table 20. After cutting the package substrate 11 by using the cutting unit 24, the fluid is sprayed from the spray nozzle 72 to the package substrate 11, thereby removing the burrs produced in cutting the package substrate 11. The fluid to be sprayed from the spray nozzle 72 is not limited on the precondition that the burrs can be removed by the fluid. For example, a liquid such as water is sprayed under pressure from the spray nozzle 72. Further, an imaging unit (not depicted) for imaging the package substrate 11 held on the chuck table 20 is provided adjacent to the fluid spraying unit 26. According to an image obtained by this imaging unit, the alignment between the fluid spraying unit 26 and the chuck table 20 is performed.

The components including the moving unit 10, the chuck table 20, the cutting unit 24, the fluid spraying unit 26, and the moving units 30a and 30b are connected to a control unit (not depicted) included in the cutting apparatus 2, so that the operation of each component is controlled by this control unit.

The pressure of the fluid to be sprayed from the spray nozzle 72 is set so that the burrs produced by cutting the package substrate 11 is properly removed. When the pressure of the fluid is increased, there is a possibility that a part of the package substrate 11 cut by the cutting blade 50 may scatter. Further, the adhesive tape 25 (see FIG. 4) is exposed by fully cutting the package substrate 11, so that there is a possibility that the high-pressure fluid may be sprayed to such an exposed area of the adhesive tape 25, causing the breakage of the adhesive tape 25. Accordingly, the pressure of the fluid is set in the range where the above inconvenience in processing the package substrate 11 does not occur. However, when the pressure of the fluid is set to a low pressure, so as to prevent the above inconvenience in processing the package substrate 11, the removal of the burrs is prone to become insufficient.

As another method, the package substrate 11 may be half cut by the cutting blade 50 to the depth such that the package substrate 11 is not fully cut. Thereafter, the burrs produced by cutting the package substrate 11 is removed by spraying the fluid. In this case, the fluid is sprayed to the package substrate 11 in the condition where the package substrate 11 is not fully cut, so that even when the pressure of the fluid is increased, the above inconvenience such as the scatter of a part of the package substrate 11 and the breakage of the adhesive tape 25 is less prone to occur. However, in the case of using this method, the package substrate 11 must be cut again by the cutting blade 50 until the package substrate 11 is fully cut. That is, the cutting operation must be performed plural times along each division line 17, causing a reduction in processing efficiency for the package substrate 11. Furthermore, in performing the cutting operation at the second time along each division line 17, there is a possibility that the cutting blade 50 may come into contact with the electrodes 19 exposed to a cut groove formed in the first-time cutting operation, so that the burrs may be produced again.

In the package substrate processing method according to this preferred embodiment, a cutting liquid containing an organic acid and an oxidizing agent is supplied in cutting the package substrate 11. After fully cutting the package substrate 11, the burrs produced by cutting the package substrate 11 are removed by spraying the fluid. By supplying this cutting liquid containing an organic acid and an oxidizing agent in cutting the package substrate 11, the electrodes 19 are modified by the organic acid and oxidized by the oxidizing agent, so that the ductility of the electrodes 19 is reduced. As a result, the electrodes 19 become resistant to drawing, thereby suppressing the production of burrs. Furthermore, the burrs can be easily removed by spraying the fluid in the next step. Accordingly, the pressure of the fluid can be reduced in spraying the fluid to remove the burrs, so that the occurrence of the above-mentioned inconvenience due to the spraying of the fluid can be suppressed. Further, the burrs can be removed without performing the cutting operation plural times along each division line 17, so that a reduction in processing efficiency can be prevented.

As the organic acid, there can be used, for example, a compound having at least one carboxyl group and at least one amino group in its molecule. In the case that this compound has two or more amino groups in its molecule, it is preferable that at least one of the amino groups is a secondary or tertiary amino group. In addition, the compound usable as the organic acid may have a substituent group.

As the organic acid, there can be used amino acids. Examples of the amino acids usable here include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihyroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, 6-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, antipain, etc. Among others, particularly preferred are glycine, L-alanine, L-proline, L-histidine, L-lysine, and dihydroxyethylglycine.

Also, amino polyacids can be used as the organic acid. Examples of the amino polyacids usable here include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, N,N'-bis(2-hydroxybenzyl)ethylenediamine-N,N'-diacetic acid, etc.

Further, carboxylic acids can be used as the organic acid. Examples of the carboxylic acids usable here include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, glutaric acid, etc., unsaturated carboxylic acids such as acrylic acid, methacrylic acid, crotonic acid, fumaric acid, maleic acid, mesaconic acid, citraconic acid, aconitic acid, etc., and cyclic unsaturated carboxylic acids such as benzoic acids, toluic acid, phthalic acids, naphthoic acids, pyromellitic acid, naphthalic acid, etc.

As the oxidizing agent, there can be used, for example, hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron(III) salts, and their organic complex salts.

Besides, an anticorrosive may be mixed in the cutting liquid. Mixing of the anticorrosive makes it possible to prevent corrosion (elution) of the metal included in the package substrate 11. As the anticorrosive, there is preferably used a heterocyclic aromatic ring compound having at least three nitrogen atoms and a fused ring structure in its molecule or a heterocyclic aromatic ring compound having at least four nitrogen atoms in its molecule. Further, the aromatic ring compound preferably includes a carboxyl group, sulfo group, hydroxyl group, or alkoxyl group. Specific preferable examples of the aromatic ring compound include tetrazole derivatives, 1,2,3-triazole derivatives, and 1,2,4-triazole derivatives.

Examples of the tetrazole derivatives usable as the anticorrosive include those which do not have a substituent group on the nitrogen atoms forming the tetrazole ring and which have, at the 5-position of the tetrazole, a substituent group selected from the group consisting of sulfo group, amino group, carbamoyl group, carbonamide group, sulfamoyl group, and sulfonamide group, or an alkyl group substituted with at least one substituent group selected from the group consisting of hydroxyl group, carboxyl group, sulfo group, amino group, carbamoyl group, carbonamide group, sulfamoyl group, and sulfonamide group.

Examples of the 1,2,3-triazole derivatives usable as the anticorrosive include those which do not have a substituent group on the nitrogen atoms forming the 1,2,3-triazole ring and which have, at the 4-position and/or 5-position of the 1,2,3-triazole, a substituent group selected from the group consisting of hydroxyl group, carboxyl group, sulfo group, amino group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

Besides, examples of the 1,2,4-triazole derivatives usable as the anticorrosive include those which do not have a substituent group on the nitrogen atoms forming the 1,2,4-triazole ring and which have, at the 2-position and/or 5-position of the 1,2,4-triazole, a substituent group selected from the group consisting of sulfo group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

The cutting liquid containing the organic acid and the oxidizing agent mentioned above is supplied from the blade cooler nozzles 58a and 58b, the shower nozzle (not depicted), and the spray nozzles 66 included in the cutting unit 24 depicted in FIG. 5 to the cutting blade 50 and the package substrate 11. However, it is sufficient that the cutting liquid is to be supplied from at least one of these nozzles.

There will now be described the package substrate processing method using the cutting apparatus 2 according to this preferred embodiment. First, the adhesive tape 25 is attached to the package substrate 11 as depicted in FIG. 4 (tape attaching step). At this time, the adhesive tape 25 is attached to the resin layer 15 side of the package substrate 11 in the condition where the front side 13a of the substrate 13 is exposed. Thereafter, the package substrate 11 is held through the adhesive tape 25 on a holding unit (holding step). In the cutting apparatus 2 depicted in FIG. 3, the chuck table 20 corresponds to this holding unit.

Figure 6:
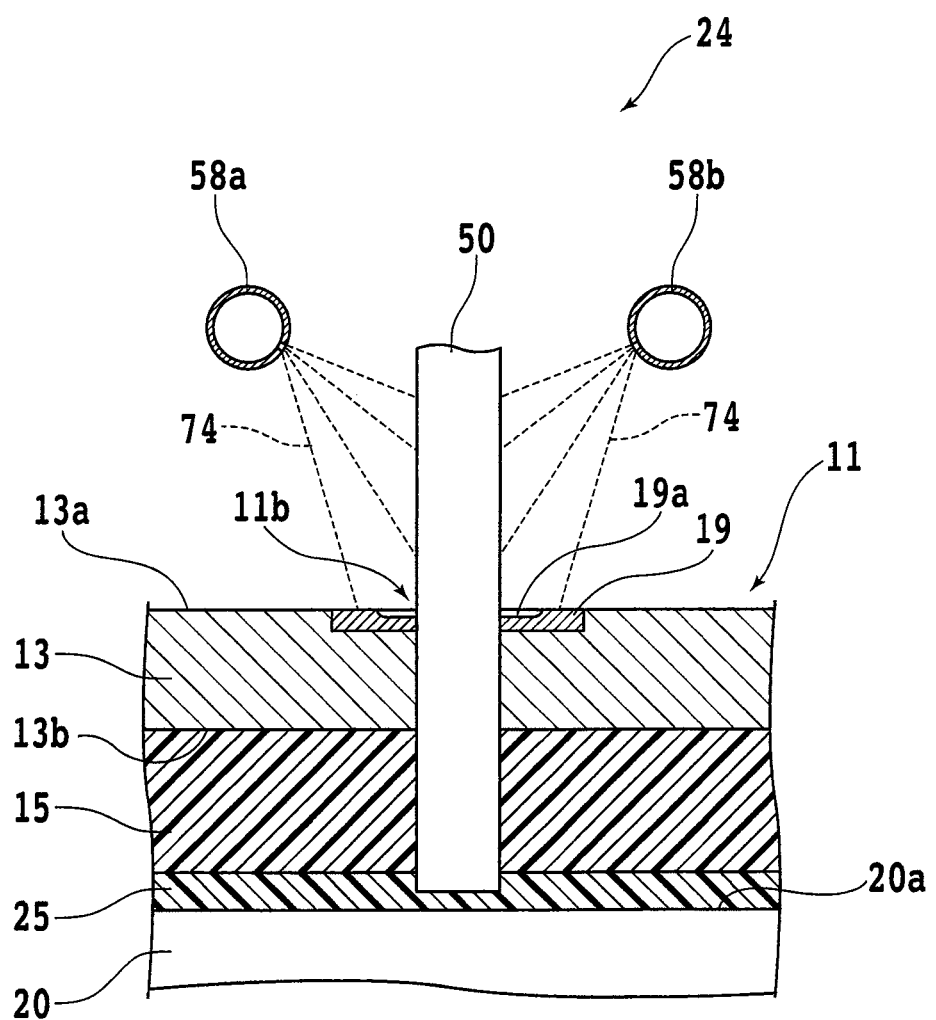
FIG. 6 is a partially sectional elevation depicting a cutting step.

Thereafter, the package substrate 11 is cut by using the cutting blade 50 (cutting step). FIG. 6 is a partially sectional elevation depicting the cutting step. In the cutting step, the cutting blade 50 is set in position so that the lower end 50a of the cutting blade 50 as viewed in FIG. 6 is lower in level than the lower surface of the resin layer 15. Further, the cutting blade 50 is rotated by rotating the spindle. Thereafter, the chuck table 20 is moved in the direction (feeding direction) substantially parallel to the holding surface 20a and substantially perpendicular to the axis of the spindle on which the cutting blade 50 is mounted. At this time, the cutting blade 50 is aligned with a predetermined one of the division lines 17 extending in the X direction. Accordingly, the cutting blade 50 being rotated and the package substrate 11 held on the chuck table 20 are relatively moved in the X direction, so that the package substrate 11 is fully cut by the cutting blade 50 to the depth where the lower end 50a of the cutting blade 50 reaches the adhesive tape 25. That is, the package substrate 11 is fully cut along the predetermined division line 17. As depicted in FIG. 6, the thickness of the cutting blade 50 is smaller than the length of the oval cavity 19a of each electrode 19 in its longitudinal direction, the plural electrodes 19 being arranged on each division line 17. Accordingly, the cutting blade 50 is allowed to pass through the inside of each cavity 19a in cutting the package substrate 11 along each division line 17.

In the cutting step, a cutting liquid 74 containing the organic acid and the oxidizing agent mentioned above is supplied from the blade cooler nozzles 58a and 58b, the shower nozzle (not depicted), and the spray nozzles 66 (see FIG. 5) toward the cutting blade 50 and the package substrate 11 in cutting the package substrate 11 as depicted in FIG. 6. At this time, the cutting liquid 74 is sprayed toward the cutting blade 50 and the package substrate 11. More specifically, the cutting liquid 74 is supplied to a cutting area 11b where the package substrate 11 is to be cut by the cutting blade 50 as depicted in FIG. 6. When the cutting liquid 74 is supplied to the cutting area 11b of the package substrate 11, each electrode 19 is modified by the organic acid contained in the cutting liquid 74 and the surface of each electrode 19 is oxidized by the oxidizing agent contained in the cutting liquid 74. As a result, the ductility of each electrode 19 is reduced to thereby suppress the production of burrs due to the cutting of each electrode 19.

Figure 7:
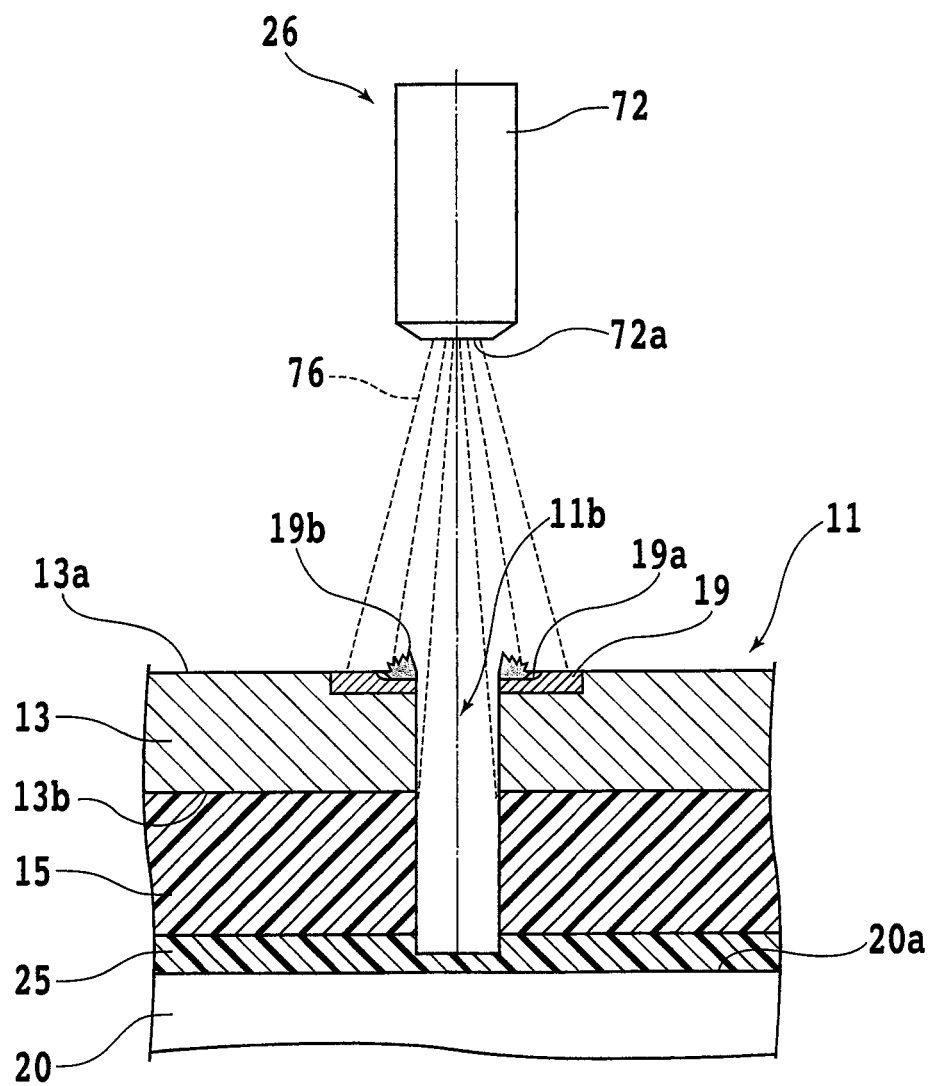
FIG. 7 is a partially sectional elevation depicting a burr removing step.

Although the production of the burrs can be suppressed by supplying the cutting liquid 74, there is a case that the production of the burrs cannot be completely avoided. In this case, a fluid is sprayed along each division line 17 to thereby remove the burrs produced in the cutting step (burr removing step). FIG. 7 is a partially sectional elevation depicting the burr removing step.

The burr removing step is performed by spraying a fluid 76 from the spray nozzle 72 included in the fluid spraying unit 26 toward the cutting area 11b of the package substrate 11 as depicted in FIG. 7. The spray nozzle 72 has a nozzle opening 72a for spraying the fluid 76 such as water under pressure, thereby blowing away burrs 19b produced from each electrode 19. By removing the burrs 19b, it is possible to prevent a reduction in quality of the package devices to be obtained by dividing the package substrate 11. The nozzle opening 72a of the spray nozzle 72 is circular as viewed in plan, for example. As depicted in FIG. 7, the spray nozzle 72 is set in position so that the center of the nozzle opening 72a coincides with the center of the cutting area 11b, i.e., the center of the nozzle opening 72a coincides with the center of a cut groove formed along each division line 17. Accordingly, when the fluid 76 is sprayed from the nozzle opening 72a positioned above and the chuck table 20 is moved in the feeding direction, the fluid 76 is sprayed along each division line 17 to thereby remove the burrs 19b.

Figure 8:
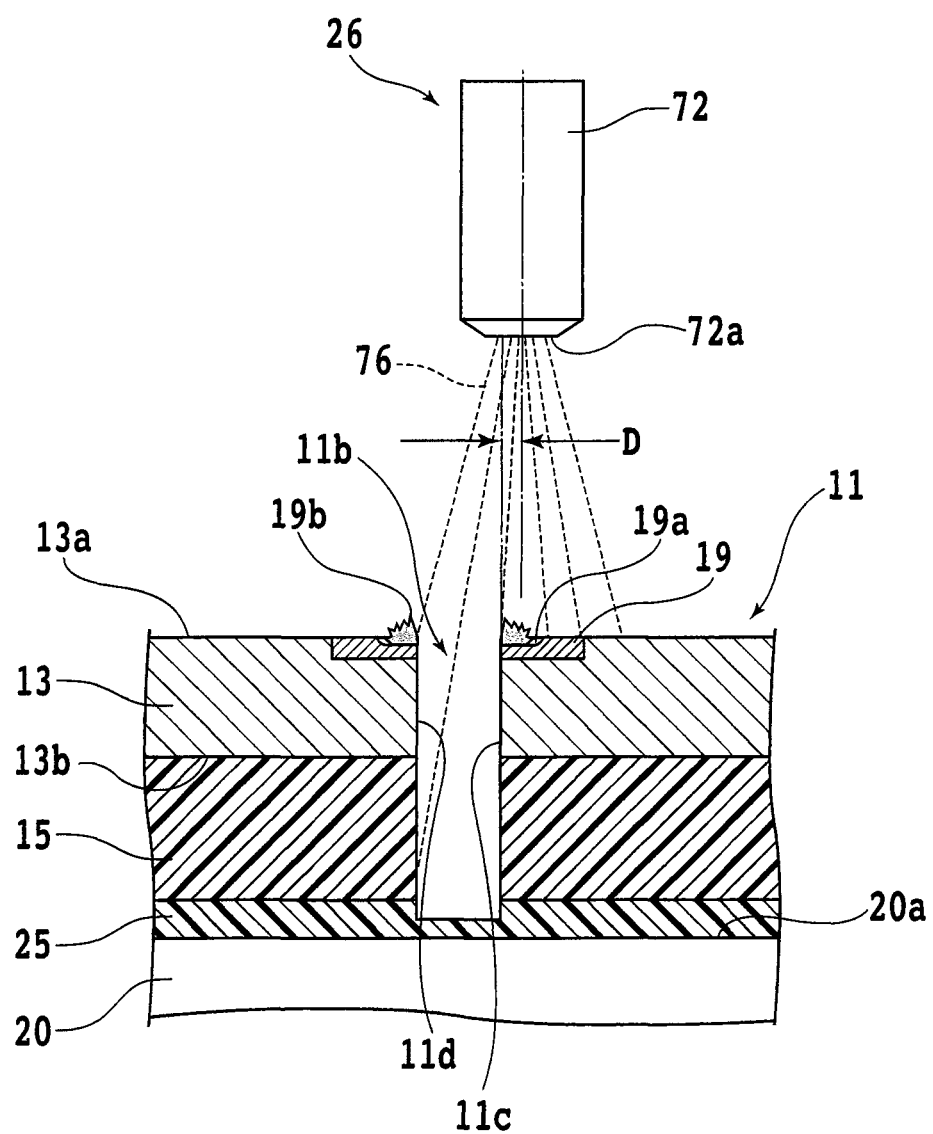
FIG. 8 is a view similar to FIG. 7, depicting a modification.

As a modification, the spray nozzle 72 may be set directly above each electrode 19 in the burr removing step, because the burrs 19b are produced from each electrode 19. FIG. 8 is a partially sectional elevation depicting this modification.

As depicted in FIG. 8, the spray nozzle 72 may be set in position so that the center of the nozzle opening 72a is aligned with each electrode 19 cut by the cutting blade 50. More specifically, the spray nozzle 72 is positioned so that the center of the nozzle opening 72a is aligned with each cavity 19a cut by the cutting blade 50, because the burrs 19b are prone to remain in each cavity 19a. With this configuration, the fluid 76 can be strongly sprayed to the burrs 19b to thereby easily remove the burrs 19b. In the cutting area lib of the package substrate 11, the cut groove is formed along each division line 17 by the cutting blade 50, in which the cut groove has a pair of opposed side walls 11c and 11d. For example, the spray nozzle 72 is positioned so that a distance D from the side wall 11c of the cut groove to the center (center line) of the nozzle opening 72a in a horizontal direction is 20 μm or less. However, the value for the distance D may be suitably set according to the sizes of each electrode 19 and each cavity 19a, for example.

Further, the fluid 76 sprayed from the spray nozzle 72 is prone to remain in each cavity 19a. Accordingly, the fluid 76 can be easily supplied to each cavity 19a in which the burrs 19b are prone to remain, according to this modification, so that the burrs 19b can be effectively removed.

After removing the burrs 19b left in each cavity 19a adjacent to the side wall 11c, the spray nozzle 72 is set again to similarly remove the burrs 19b left in each cavity 19a adjacent to the other side wall 11d. In this manner, the fluid 76 is sprayed to the burrs 19b left in the cavities 19a left adjacent to both the side walls 11c and 11d, so that the burrs 19b can be reliably removed. The cutting step and the burr removing step are performed along all of the crossing division lines 17 of the package substrate 11, thereby dividing the package substrate 11 into the plural package devices.

The movement of the cutting unit 24 and the movement of the fluid spraying unit 26 are separately controlled by the moving units 30a and 30b, respectively, depicted in FIG. 3. Accordingly, the timing for spraying the fluid 76 to the package substrate 11 can be freely set. For example, the package substrate 11 may be cut by the cutting unit 24 as moving the chuck table 20 in a first feeding direction (forward direction). Thereafter, the burrs may be removed by the fluid spraying unit 26 as moving the chuck table 20 in a second feeding direction (backward direction) opposite to the first feeding direction. In this manner, the cutting step and the burr removing step can be performed along each division line 17 both in the forward direction and in the backward direction. However, the timing for removing the burrs is not limited to the above. For example, after cutting the package substrate 11 along all of the division lines 17, the removal of the burrs may be performed along all of the division lines 17. As another method, simultaneously with the cutting of the package substrate 11 along a predetermined one of the division lines 17, the removal of the burrs may be performed along the previous division line 17 which has already cut. In this case, the cutting of the package substrate 11 and the removal of the burrs can be performed simultaneously.

While the position of the cutting unit 24 and the position of the fluid spraying unit 26 are controlled independently of each other in the above preferred embodiment, the cutting unit 24 and the fluid spraying unit 26 may be formed integrally. For example, the spray nozzle 72 is mounted to the blade cover 52 depicted in FIG. 5 so as to form a unit which performs cutting and spraying the fluid. In this case, the cutting blade 50 and the spray nozzle 72 integrally moved, so that the following the cutting of the package substrate 11 by the cutting blade 50, the removal of the burrs by the spray nozzle 72 is performed.

As described above, in the package substrate processing method according to this preferred embodiment, the cutting step is performed to cut the package substrate 11 by using the cutting blade 50 as supplying the cutting liquid 74 containing the organic acid and the oxidizing agent. Thereafter, the burr removing step is performed to remove the burrs by spraying the fluid 76. By supplying the cutting liquid 74, the production of the burrs can be suppressed and the burrs can be easily removed in the next step. Accordingly, the pressure of the fluid 76 for removing the burrs can be reduced. As a result, the burrs can be removed as suppressing the occurrence of the inconvenience in processing the package substrate 11 and also suppressing a reduction in processing efficiency.

Figure 9A:
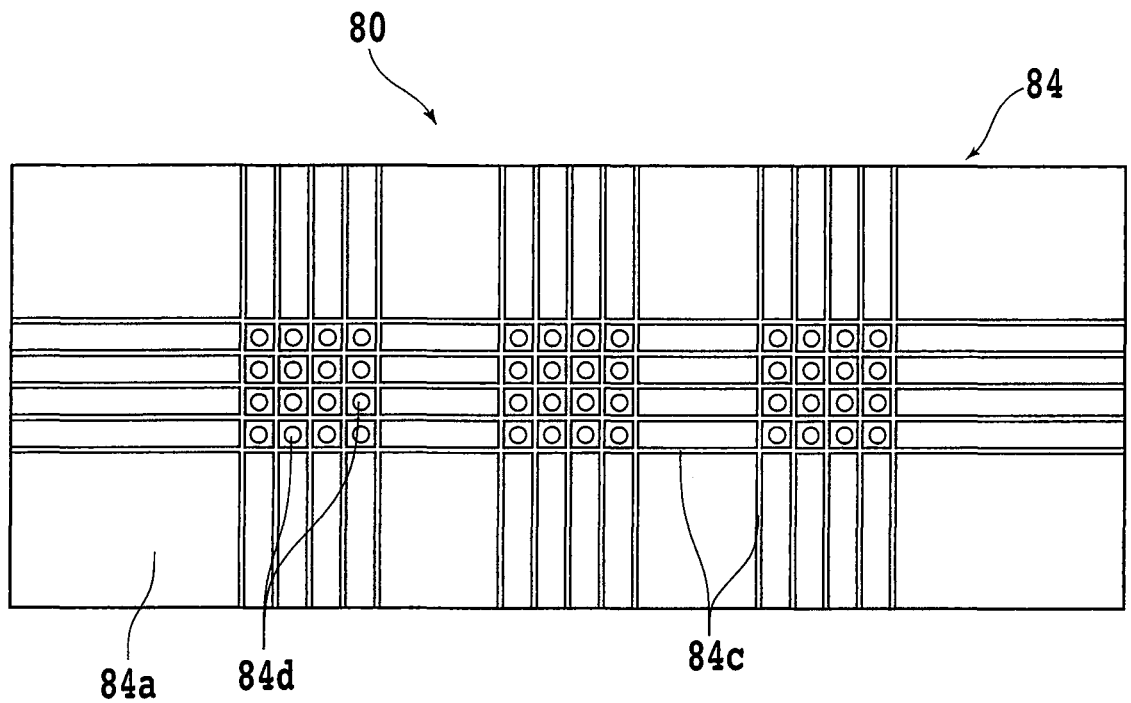
FIG. 9A is a plan view depicting a jig table usable in the present invention.
Figure 9B:
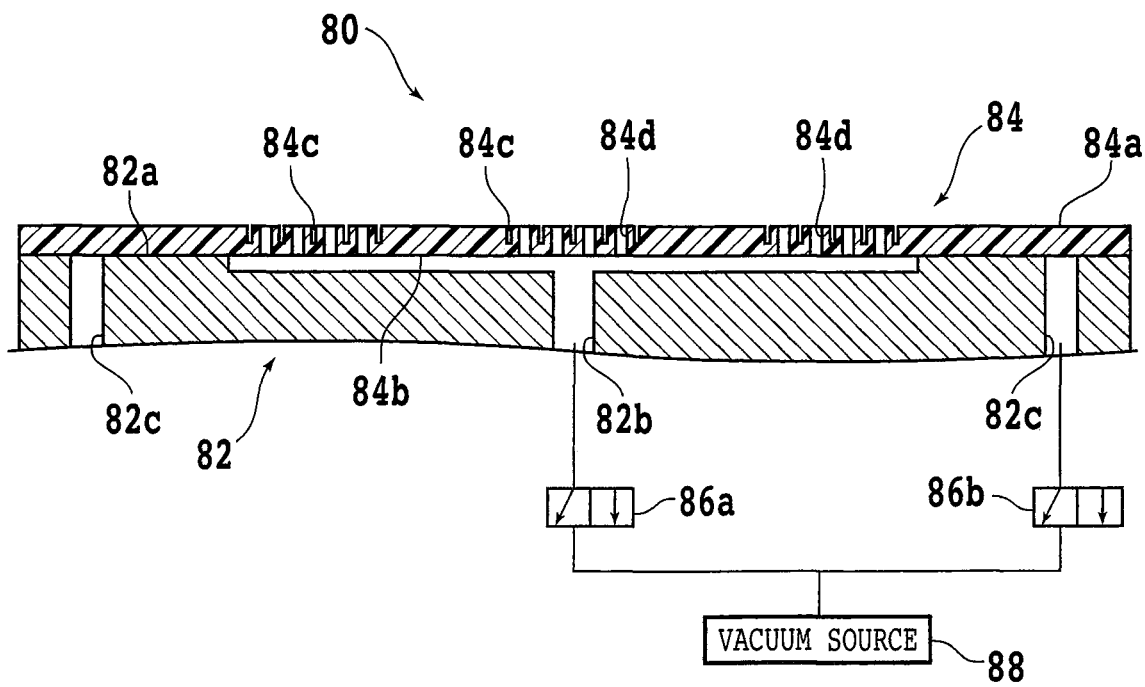
FIG. 9B is a sectional view of the jig table depicted in FIG. 9A.

While the package substrate 11 is held through the adhesive tape 25 on the chuck table 20 as the holding unit under suction in the above preferred embodiment, a jig table may be used as the holding unit for holding the package substrate 11. FIGS. 9A and 9B depict such a jig table 80 for holding the package substrate 11 according to a second preferred embodiment. FIG. 9A is a plan view of the jig table 80, and FIG. 9B is a sectional view of the jig table 80.

As depicted in FIGS. 9A and 9B, the jig table 80 includes a jig base 82 having a rectangular shape as viewed in plan. The jig base 82 is adapted to be placed on the movable block 8 depicted in FIG. 3 by exchanging the chuck table 20. The jig base 82 is connected to a rotational drive source (not depicted) such as a motor. The jig base 82 has a rotation axis substantially parallel to a vertical direction. Accordingly, by operating the rotational drive source, the jig base 82 is rotated about its vertical axis. The jig base 82 has an upper surface 82a for removably mounting a holding member 84. The holding member 84 has a shape corresponding to the shape of the package substrate 11.

The holding member 84 is a plate-shaped member having a rectangular shape as viewed in plan. The holding member 84 has an upper surface as a holding surface 84a for holding the package substrate 11 under suction. A plurality of crossing grooves 84c respectively corresponding to the plural crossing division lines 17 of the package substrate 11 are formed on the holding surface 84a of the holding member 84. That is, the upper end of each groove 84c opens to the holding surface 84a. Accordingly, a plurality of rectangular separate regions respectively corresponding to the plural rectangular separate regions 11a (see FIG. 1A) of the package substrate 11 are defined by these grooves 84c on the holding surface 84a. Each separate region defined by the grooves 84c has a suction hole 84d extending from the upper surface of the holding member 84 to the lower surface thereof. A first passage 82b is formed on the upper surface 82a of the jig base 82 at its central portion. When the holding member 84 is mounted on the upper surface 82a of the jig base 82 as depicted in FIG. 9B, each suction hole 84d of the holding member 84 is connected to the first passage 82b of the jig base 82.

The first passage 82b is connected through a valve 86a to a vacuum source 88. Accordingly, when the valve 86a is opened in the condition where the package substrate 11 is placed on the holding surface 84a of the holding member 84 and each division line 17 of the package substrate 11 is vertically aligned with the corresponding groove 84c of the holding member 84, the package substrate 11 can be held on the jig table 80 under suction. Further, a second passage 82c for mounting the holding member 84 on the jig base 82 is formed in a peripheral portion of the jig base 82. The second passage 82c is connected through a valve 86b to the vacuum source 88. Accordingly, when the valve 86b is opened in the condition where the lower surface 84b of the holding member 84 is in contact with the upper surface 82a of the jig base 82, the holding member 84 is fixed to the upper surface 82a of the jig base 82 by the vacuum applied from the vacuum source 88.

Figure 10:
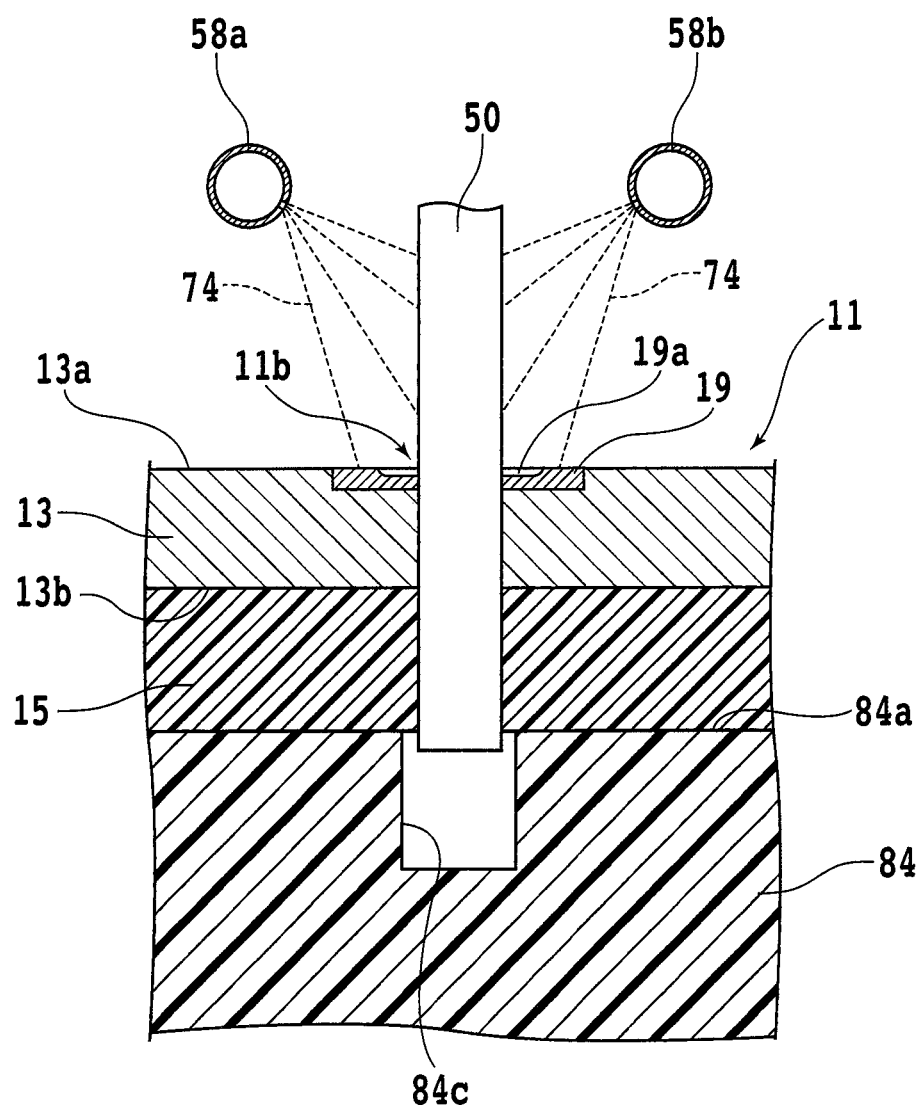
FIG. 10 is a partially sectional elevation depicting a cutting step using the jig table depicted in FIGS. 9A and 9B.

In this preferred embodiment, the cutting step and the burr removing step can be performed in the condition where the package substrate 11 is held on the jig table 80. FIG. 10 is a partially sectional elevation depicting the cutting step using the jig table 80. When the package substrate 11 is held on the jig table 80, the division lines 17 of the package substrate 11 are vertically aligned with the grooves 84c of the holding member 84, respectively. Thereafter, the cutting blade 50 is set in position so that the lower end of the cutting blade 50 is lower in level than the upper opening of each groove 84c. In this condition, the jig table 80 is moved in the feeding direction to thereby fully cut the package substrate 11 along each division line 17 by the cutting blade 50 being rotated. That is, the package substrate 11 is fully cut along each division line 17 by the cutting blade 50 to the depth where the lower end of the cutting blade 50 reaches the corresponding groove 84c of the holding member 84 of the jig table 80 as depicted in FIG. 10.

After performing this cutting step, the burr removing step is performed by spraying the fluid to the package substrate 11 held on the jig table 80. The other steps in the second preferred embodiment are similar to those in the first preferred embodiment.

The package substrate 11 processed by using the package substrate processing method according to the first preferred embodiment was evaluated. The result of this evaluation will now be described. In this evaluation, the package substrate 11 was held through the adhesive tape 25 on the chuck table 20, and the cutting step was then performed as supplying the cutting liquid containing the organic acid and the oxidizing agent. Thereafter, the burr removing step was performed by spraying the fluid under a predetermined pressure. Thereafter, it was observed whether or not the adhesive tape 25 attached to the package substrate 11 processed above was broken and whether or not the burrs were left on the package substrate 11.

As the package substrate 11, a quad flat non-lead package (QFN) substrate having a width of 65 mm, a length of 75 mm, and a thickness of 0.55 mm was used. As the adhesive tape 25, a tape (D-218) manufactured by Lintec Corporation was used, in which this tape includes a base sheet formed of polyethylene terephthalate (PET) and has a thickness of 200 μm. In the condition where the package substrate 11 was held through the adhesive tape 25 on the chuck table 20, the cutting step was performed by positioning the cutting blade 50 to the depth reaching the adhesive tape 25 and then fully cutting the package substrate 11 along each division line 17. In cutting the package substrate 11, the cutting liquid containing the organic acid and the oxidizing agent was supplied. Thereafter, the burr removing step was performed by spraying the fluid from the spray nozzle 72 toward each division line 17. In the burr removing step, water was used as the fluid. Further, the pressure of the fluid to be sprayed from the spray nozzle 72 was changed to 25 MPa, 30 MPa, 35 MPa, and 40 MPa. Under these conditions, it was observed whether or not the adhesive tape 25 attached to the package substrate 11 processed by the burr removing step was broken. Further, it was also observed whether or not the burrs were left on the package substrate 11.

The result of evaluation of the package substrate 11 is indicated in Table 1. In Table 1, the result of comparison is also depicted, in which the comparison was performed by using pure water as the cutting liquid and setting the pressure of the fluid to be sprayed from the spray nozzle 72 to 35 MPa.

TABLE 1

| Subject | | Fluid (water) pressure | | | |
|---|---|---|---|---|---|
| Cutting liquid | observed | 25 MPa | 30 MPa | 35 MPa | 40 MPa |
| Organic acid + | Tape broken | No | No | No | Yes |
| Oxidizing agent | Burrs left | Yes | No | No | No |
| Pure water | Burrs left | | | Yes | |

As indicated in Table 1, in the case that pure water was used as the cutting liquid and the pressure of the fluid for removing the burrs was set to 35 MPa as the comparison, it was confirmed that the burrs were left on the package substrate 11. This result depicts that when pure water is used as the cutting liquid and the pressure of the fluid is set to 35 MPa, the removal of the burrs is insufficient. Accordingly, in the case of using pure water as the cutting liquid, the pressure of the fluid is usually set to approximately 70 MPa. In contrast, when the cutting liquid containing the organic acid and the oxidizing agent according to the present invention was used and the pressure of the fluid was set to 30 MPa, 35 MPa, and 40 MPa, the burrs were not remarkably observed on the package substrate 11. This result depicts that the fluid pressure required for the removal of the burrs is reduced as compared with the case of using pure water as the cutting liquid. This result is assumed to be due to the fact that the supply of the cutting liquid containing the organic acid and the oxidizing agent can suppress the production of burrs and can facilitate the removal of the burrs. However, in the case that the fluid pressure was set to 25 MPa, it was observed that the burrs were slightly left on the package substrate 11. Accordingly, to reliably remove the burrs, the fluid pressure is preferably set to a value greater than 25 MPa, more preferably to 30 MPa or more.

Further, when the cutting liquid containing the organic acid and the oxidizing agent was used and the fluid pressure was set to 40 MPa, the breakage of the adhesive tape 25 was observed. Accordingly, to prevent the breakage of the adhesive tape 25 in the burr removing step, the fluid pressure is preferably set to a value less than 40 MPa, more preferably to 35 MPa or less. In this manner, the pressure of the fluid to be sprayed in the burr removing step is preferably set to a value such that the burrs can be removed and the occurrence of the inconvenience in processing the package substrate 11 (e.g., the breakage of the adhesive tape 25 and the scatter of a part of the package substrate 11) can be suppressed.

In summary, it is confirmed from the above result that when the cutting liquid containing the organic acid and the oxidizing agent according to the present invention is used in cutting the package substrate 11, the pressure of the fluid to be sprayed in removing the burrs can be reduced, so that the occurrence of the inconvenience in processing the package substrate 11 can be suppressed and the burrs can be removed.

Further, the structure, method, etc. according to the above preferred embodiments may be suitably modified without departing from the scope of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A package substrate processing method for processing a package substrate having a division line, a metal electrode being formed on said division line, said package substrate processing method comprising:

a cutting step of cutting said package substrate along said division line by using a cutting blade, wherein said cutting step includes rotating said cutting blade and passing said cutting blade through said metal electrode, and also wherein, during said cutting step, said rotating cutting blade passes completely through said package substrate; and a burr removing step of removing burrs produced from said metal electrode in said cutting step by spraying a fluid to said package substrate along said division line after performing said cutting step, wherein during said burr removing step, the fluid is provided at a pressure of between 30 MPa and 35 MPa;

said cutting step including a step of supplying a cutting liquid containing an organic acid and an oxidizing agent to a cutting area where said package substrate is to be cut by said cutting blade, and wherein:
  during said cutting step, the cutting fluid is supplied from at least one nozzle block that is configured and arranged to move with a cutting unit that includes said cutting blade, and
  during said burr removing step, the fluid used for removing burrs produced from said metal electrode is supplied from a fluid spraying unit that is configured and arranged to move separately from the cutting unit, and further wherein:
  the package substrate includes a plurality of said division lines;
  said cutting step is performed on a first one of said division lines;
  after performing the cutting step on the first one of said division lines, said cutting step is performed on a second one of said division lines, where said second one of said division line is adjacent to said first one of said division lines; and
  said burr removing step is performed on said first one of said division lines while said cutting step is performed on said second one of said division lines.

2. The package substrate processing method according to claim 1, wherein:
  said cutting step is performed by moving the cutting unit in a first direction; and
  said burr removing step is performed by moving the fluid spraying unit in a second direction, where the second direction is opposite of the first direction.

3. A package substrate processing method for processing a package substrate having a division line, an electrode being formed on said division line, said package substrate processing method comprising:
  a tape attaching step of attaching an adhesive tape to said package substrate before performing said cutting step; and
  a holding step of holding said package substrate through said adhesive tape on a holding unit after performing said tape attaching step;
  a cutting step of cutting said package substrate along said division line by using a cutting blade, wherein said cutting step includes a step of supplying a cutting liquid containing an organic acid and an oxidizing agent to a cutting area where said package substrate is to be cut by said cutting blade, and further wherein said cutting step is performed after performing said holding step;
  said cutting step being performed by fully cutting said package substrate attached to said adhesive tape along said division line to a depth where said cutting blade reaches said adhesive tape in a condition where said package substrate is held through said adhesive tape on said holding unit; and
  a burr removing step of removing burrs produced from said electrode in said cutting step by spraying a fluid to said package substrate along said division line after performing said cutting step;
  said burr removing step being performed by spraying said fluid in a condition where said adhesive tape is attached to said package substrate, and wherein:
  during said cutting step, the cutting fluid is supplied from at least one nozzle block that is configured and arranged to move with a cutting unit that includes said cutting blade, and
  during said burr removing step, the fluid used for removing burrs produced from said metal electrode is supplied from a fluid spraying unit that is configured and arranged to move separately from the cutting unit, and further wherein:
  the package substrate includes a plurality of said division lines;
  said cutting step is performed on a first one of said division lines;
  after performing the cutting step on the first one of said division lines, said cutting step is performed on a second one of said division lines, where said second one of said division line is adjacent to said first one of said division lines; and
  said burr removing step is performed on said first one of said division lines while said cutting step is performed on said second one of said division lines.

4. The package substrate processing method according to claim 3, wherein said electrode comprises a metal electrode, and further wherein said cutting step includes rotating said cutting blade and passing said cutting blade through said metal electrode.

5. The package substrate processing method according to claim 3, wherein, during said burr removing step, the fluid is provided at a pressure of a value that is greater than 25 MPa and less than 40 MPa.

6. The package substrate processing method according to claim 3, wherein, during said burr removing step, the fluid is provided at a pressure of between 30 MPa and 35 MPa.

7. The package substrate processing method according to claim 3, wherein:
  said cutting step is performed by moving the cutting unit in a first direction; and
  said burr removing step is performed by moving the fluid spraying unit in a second direction, where the second direction is opposite of the first direction.

8. A package substrate processing method for processing a package substrate having a division line, an electrode being formed on said division line, said package substrate processing method comprising:
  a holding step of holding said package substrate on a jig table having a groove corresponding to said division line;
  a cutting step of cutting said package substrate along said division line by using a cutting blade, said cutting step being performed by fully cutting said package substrate along said division line to the depth where said cutting blade reaches said groove of said jig table in a condition where said package substrate is held on said jig table, and further wherein said cutting step is performed after performing said holding step; and
  a burr removing step of removing burrs produced from said electrode in said cutting step by spraying a fluid to said package substrate along said division line after performing said cutting step, said burr removing step being performed by spraying said fluid to said package substrate held on said jig table, and wherein said cutting step includes a step of supplying a cutting liquid containing an organic acid and an oxidizing agent to a cutting area where said package substrate is to be cut by said cutting blade, and wherein:
  during said cutting step, the cutting fluid is supplied from at least one nozzle block that is configured and arranged to move with a cutting unit that includes said cutting blade, and
  during said burr removing step, the fluid used for removing burrs produced from said metal electrode is supplied from a fluid spraying unit that is configured and arranged to move separately from the cutting unit, and further wherein:
  the package substrate includes a plurality of said division lines;
  said cutting step is performed on a first one of said division lines;
  after performing the cutting step on the first one of said division lines, said cutting step is performed on a second one of said division lines, where said second one of said division line is adjacent to said first one of said division lines; and
  said burr removing step is performed on said first one of said division lines while said cutting step is performed on said second one of said division lines.

9. The package substrate processing method according to claim 8, wherein said electrode comprises a metal electrode, and further wherein said cutting step includes rotating said cutting blade and passing said cutting blade through said metal electrode.

10. The package substrate processing method according to claim 8, wherein, during said burr removing step, the fluid is provided at a pressure of a value that is greater than 25 MPa and less than 40 MPa.

11. The package substrate processing method according to claim 8, wherein, during said burr removing step, the fluid is provided at a pressure of between 30 MPa and 35 MPa.

12. The package substrate processing method according to claim 8, wherein:
  said cutting step is performed by moving the cutting unit in a first direction; and
  said burr removing step is performed by moving the fluid spraying unit in a second direction, where the second direction is opposite of the first direction.

* * * * *